(12) United States Patent
Wang et al.

(10) Patent No.: US 10,023,794 B2
(45) Date of Patent: Jul. 17, 2018

(54) FLUORIDE PHOSPHOR INCLUDING SHEET-LIKE CRYSTAL AND MANUFACTURING METHOD AND APPLICATION THEREOF

(71) Applicant: Lextar Electronics Corporation, Hsinchu (TW)

(72) Inventors: Ren-Hong Wang, Taichung (TW); Wen-Li Zhou, ChangSha (CN); Ru-Shi Liu, New Taipei (TW); Ching-Yi Chen, New Taipei (TW); Wen-Wan Tai, Kaohsiung (TW); Yu-Chun Lee, Zhubei (TW); Tzong-Liang Tsai, Taichung (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 15/725,434

(22) Filed: Oct. 5, 2017

(65) Prior Publication Data
US 2018/0105744 A1 Apr. 19, 2018

(30) Foreign Application Priority Data

Oct. 19, 2016 (TW) .............................. 105133722 A

(51) Int. Cl.
| C09K 11/67 | (2006.01) |
| H01L 33/50 | (2010.01) |
| H01L 33/06 | (2010.01) |
| H01L 33/46 | (2010.01) |

(52) U.S. Cl.
CPC ............ *C09K 11/675* (2013.01); *H01L 33/06* (2013.01); *H01L 33/502* (2013.01); *H01L 33/46* (2013.01)

(58) Field of Classification Search
CPC ..... C09K 11/675; H01L 33/06; H01L 33/502; H01L 33/46
See application file for complete search history.

(56) References Cited

U.S. PATENT DOCUMENTS

| 8,057,706 B1 | 11/2011 | Setlur et al. |
| 8,237,348 B2 | 8/2012 | Masuda et al. |

(Continued)

FOREIGN PATENT DOCUMENTS

| CN | 101705095 A | 5/2010 |
| EP | 0479298 A1 | 4/1992 |

(Continued)

OTHER PUBLICATIONS

TW Office Action dated Apr. 19, 2017 in corresponding Taiwan application (No. 105133722).

(Continued)

*Primary Examiner* — Mohsen Ahmadi
*Assistant Examiner* — Patricia Reddington
(74) *Attorney, Agent, or Firm* — McClure, Qualey & Rodack, LLP

(57) ABSTRACT

A fluoride phosphor including a sheet-like crystal and a manufacturing method and an application therefore are disclosed. The fluoride phosphor has a chemical formula $A_2[MF_6]:Mn^{4+}$, with $Mn^{4+}$ as an activator. The A is Li, Na, K, Rb, Cs, NH4 or a combination thereof. The M is Ge, Si, Sn, Ti, Zr or a combination thereof. The sheet-like crystal has a thickness d. A crystal flat surface of the sheet-like crystal has a maximum length a. The maximum length a is defined as a distance between two end points on an edge of the crystal flat surface and farthest from each other. $8 \leq a/d \leq 35$.

7 Claims, 14 Drawing Sheets

(56) References Cited

U.S. PATENT DOCUMENTS

| | | |
|---|---|---|
| 8,252,613 B1 | 8/2012 | Lyons et al. |
| 8,362,685 B2 | 1/2013 | Masuda et al. |
| 8,491,816 B2 | 7/2013 | Hong et al. |
| 8,974,696 B2 | 3/2015 | Kaneyoshi et al. |
| 9,045,689 B2 | 6/2015 | Zhang et al. |
| 2012/0161170 A1 | 6/2012 | Dubuc et al. |
| 2015/0008463 A1 | 1/2015 | Yoshida |

FOREIGN PATENT DOCUMENTS

| | | |
|---|---|---|
| EP | 2508586 A2 | 10/2012 |
| EP | 2663611 A1 | 11/2013 |
| TW | 201307527 A | 2/2013 |
| WO | 2013088313 A1 | 6/2013 |
| WO | 2013121355 A1 | 8/2013 |

OTHER PUBLICATIONS

Jiang, et al.: "A red phosphor BaTiF6:Mn4+: reaction mechanism, microstructures, optical properties, and applications for white LEDs"; Dalton Trans., 2014, 43, 9414; © The Royal Society of Chemistry; pp. 1-5.

Zhu, et al.: "Highly efficient non-rare-earth red emitting phosphor for warm white light-emitting diodes"; Received Jan. 29, 2014 | Accepted Jun. 6, 2014 | Published Jul. 8, 2014; Macmillan Publishers Limited; pp. 1-11.

Lv, et al.: "Optimized photoluminescence of red phosphor K2TiF6:Mn4+ synthesized at room temperature and its formation mechanism"; J. Mater. Chem. C, 2015, 3, 1935; © The Royal Society of Chemistry 2015; pp. 1-7.

Takahashi, et al.: "Mn4+-Activated Red Photoluminescence in K2SiF6 Phosphor"; Journal of the Electrochemical Society, 155 12 E183-E188 2008; Graduate School of Engineering, Gunma University, Gunma 376-8515, Japan; pp. 1-6.

Han, et al.: "Large micro-sized K2TiF6:Mn4+ red phosphors synthesised by a simple reduction reaction for high colour-rendering white light-emitting diodes"; RSC Adv., 2015, 5, 100054; © The Royal Society of Chemistry; pp. 1-6.

Lv, et al.: "Optimized photoluminescence of red phosphor K2TiF6:Mn4+ synthesized at room temperature and its formation mechanism"; J. Mater. Chem. C, 2015, 3, 1935; © The Royal Society of Chemistry; pp. 1-7.

_US 10,023,794 B2_

FLUORIDE PHOSPHOR INCLUDING SHEET-LIKE CRYSTAL AND MANUFACTURING METHOD AND APPLICATION THEREOF

This application claims the benefit Taiwan application Serial No. 105133722, filed Oct. 19, 2016, the subject matters of which are incorporated herein by reference.

BACKGROUND OF THE INVENTION

Field of the Invention

The invention relates in general to a fluoride phosphor and a manufacturing method and an application thereof, and particularly relates to a fluoride phosphor including sheet-like crystal and a manufacturing method and an application thereof.

Description of the Related Art

A light emitting diode (LED) is a mainly used light source for a white light illuminating source and a white light source of a back light module. A method for realizing a white LED comprises using a blue LED chip with a yellow phosphor powder, or using the blue LED chip with a red phosphor powder and a green phosphor powder, or using a UV LED chip with a blue phosphor powder, the red phosphor powder and the green phosphor powder. Among which, the method using the blue LED chip with the yellow phosphor powder lacks a red light spectrum, and thus may use an additional red phosphor powder for adjusting a color temperature.

A fluoride of $A_2[MF_6]:Mn^{4+}$ may be used as a red phosphor powder material for a LED. In the fluoride, the A is Li, Na, K, Rb, Cs, NH4 or a combination thereof, the M is Ge, Si, Sn, Ti, Zr or a combination thereof. However, a conventional fluoride phosphor powder has a bulk shape crystal having a surface defect. It results in the fluoride phosphor powder having a low quantum efficiency and a low light emitting efficiency due to a light scattering in the phosphor powder.

SUMMARY OF THE INVENTION

The present disclosure relates to a fluoride phosphor powder including a sheet-like crystal and a manufacturing method and an application thereof.

According to a concept of the present disclosure, a wavelength converting material is provided. The wavelength converting material comprises a fluoride phosphor powder with a $Mn^{4+}$ as an activator. The fluoride phosphor powder with the $Mn^{4+}$ as the activator comprises a sheet-like crystal and has a chemical formula of $A_2[MF_6]:Mn^{4+}$, wherein A is Li, Na, K, Rb, Cs, NH4, or a combination thereof, and M is Ge, Si, Sn, Ti, Zr, or a combination thereof. The sheet-like crystal has a thickness d. A crystal flat surface of the sheet-like crystal has a maximum length a. The maximum length a is defined as a distance between two end points on an edge of the crystal flat surface and farthest from each other. $8 \leq a/d \leq 35$ According to another concept of the present disclosure, a manufacturing method for a fluoride phosphor powder having a sheet-like crystal is provided. The method comprises the following steps. A first solution is provided. The first solution comprises a precursor for Mn and A elements. The precursor for Mn and A elements is a fluoride. The A element comprises Li, Na, K, Rb, Cs, NH4, or a combination thereof. A second solution is provided. The second solution comprises a polar solvent and a precursor for M element. The M element comprises Ge, Si, Sn, Ti, Zr or a combination thereof. The polar solvent comprises an alcohol solvent. The first solution and the second solution are mixed to obtain the fluoride phosphor powder having the sheet-like crystal.

According to yet another concept of the present disclosure, a light emitting device is provided. The light emitting device comprises a light emitting diode chip and a wavelength converting material. The wavelength converting material is capable of being excited by a first light emitted from the light emitting diode chip to emit a second light having a wavelength different from a wavelength of the first light. The wavelength converting material comprises a fluoride phosphor powder with a $Mn^{4+}$ as an activator. The fluoride phosphor powder with the $Mn^{4+}$ as the activator comprises a sheet-like crystal and has a chemical formula of $A_2[MF_6]:Mn^{4+}$. The A is Li, Na, K, Rb, Cs, NH4, or a combination thereof. The M is Ge, Si, Sn, Ti, Zr, or a combination thereof. The sheet-like crystal has a thickness d. A crystal flat surface of the sheet-like crystal has a maximum length a. The maximum length a is defined as a distance between two end points on an edge of the crystal flat surface and farthest from each other. $8 \leq a/d \leq 35$ The above and other aspects of the invention will become better understood with regard to the following detailed description of the preferred but non-limiting embodiment (s). The following description is made with reference to the accompanying drawings.

DETAILED DESCRIPTION OF THE INVENTION

Embodiments provide a fluoride phosphor powder and a manufacturing method and an application for the fluoride phosphor powder. The fluoride phosphor powder has an excellent luminous efficiency.

The illustrations may not be necessarily drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments. The illustration uses the same/similar symbols to indicate the same/similar elements.

The fluoride phosphor powder is a fluoride phosphor powder with the $Mn^{4+}$ as an activator. The fluoride phosphor powder has a chemical formula of $A_2[MF_6]:Mn^{4+}$, and includes a sheet-like crystal, wherein the Mn element is a luminous center. The A element is Li, Na, K, Rb, Cs, NH4 or a combination thereof. The M element is Ge, Si, Sn, Ti, Zr or a combination thereof. In an embodiment, for example, the fluoride phosphor powder has a chemical formula of $K_2[TiF_6]:Mn^{4+}$.

The sheet-like crystal of the fluoride phosphor powder has a thickness d and a crystal flat surface. The crystal flat surface may be perpendicular to a thickness direction. The crystal flat surface of the sheet-like crystal has a maximum length a. The maximum length a is defined as a distance between the two farthest end points on an edge of the crystal flat surface and farthest from each other. For example, the sheet-like crystal of the fluoride phosphor powder may have two the crystal flat surfaces substantially parallel to each other. A thickness d is defined between the two crystal flat surfaces. At least one of the two crystal flat surfaces has the maximum length a. In embodiments, $2.5 < a/d \leq 100$, such as $8 \leq a/d \leq 35$. For example, a=5-200 um. The fluoride phosphor powder emits a red light having a peak wavelength in a range of about 600 nm to about 650 nm after being excited by a light having a peak wavelength in a range of about 300 nm to about 470 nm.

Figure 1:
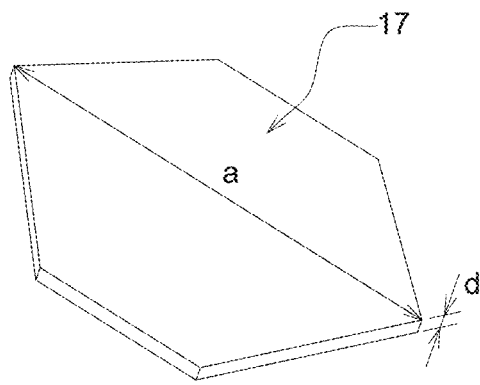
FIG. 1 illustrates a fluoride phosphor powder having a hexagon sheet-like crystal according to an embodiment.

For example, FIG. 1 illustrates the fluoride phosphor powder according to embodiments. The sheet-like crystal 11 of the fluoride phosphor powder has a hexagon shape. In other words, the crystal flat surface 17 of the sheet-like crystal 11 has a hexagon shape. The sheet-like crystal 11 has the thickness d defined between the upper and lower crystal flat surfaces 17. In this embodiment, the crystal flat surface 17 has the maximum length a equal to the distance between the farthest two opposing corner points.

The crystal flat surface is not limited to the hexagon shape, and may be other polygonal shapes, such as a trilateral shape, a quadrilateral shape, a pentagon shape, etc.

In embodiments, the fluoride phosphor powder having the sheet-like crystal may be manufactured by a method comprising individually preparing a first solution an a second solution, then mixing the first solution with the second solution to obtain the fluoride phosphor powder having the sheet-like crystal.

The first solution comprises a precursor for the Mn and A elements. The A element comprises Li, Na, K, Rb, Cs, NH4 or a combination thereof. In an embodiment, the precursor for the Mn and A elements is a fluoride, for example, comprising $KHF_2$, $K_2MnF_6$, etc. In embodiments, the first solution may further comprise a solvent, for example, comprising a HF solvent, etc. The HF solvent is capable of dissolving the Mn and A elements containing fluoride precursor for forming a stable solution, avoiding a degeneration by preventing the Mn and A elements containing fluoride precursor from a reaction.

The second solution comprises a polar solvent and a precursor for the M element. The M element comprises Ge, Si, Sn, Ti, Zr, or a combination thereof. In an embodiment, the precursor for the M element comprises an isopropyl alcoholate for the M element, for example, comprising titanium isopropoxide, etc. Using the polar solvent benefits an isotropic growth for the fluoride phosphor powder for forming the sheet-like crystal. The polar solvent comprises an alcohol solvent, for example, comprising methanol, ethanol, propanol, butanol, amyl alcohol, etc. In an embodiment, the polar solvent comprises 1-propanol.

In embodiments, a co-precipitation reaction occurs from the mixing the first solution and the second solution. The co-precipitation reaction forms the fluoride phosphor powder having the sheet-like crystal. In embodiments, after the mixing the first solution with the second solution, a washing step and a drying step may be performed to the fluoride phosphor powder including the sheet-like crystal to further purify and dry the fluoride phosphor powder.

The sheet-like crystal of the fluoride phosphor powder manufactured according to the method of embodiments has a high crystal quality, i.e. having a smooth surface, and few surface defects. This structure characteristic can reduce a light scattering to decrease an energy loss. Therefore, the fluoride phosphor powder can perform good external quantum efficiency, suitable for various products using a phosphor powder for increasing a luminous efficiency of a device.

In an embodiment, for example, the fluoride phosphor powder is used in a light emitting device. In embodiments, the light emitting device comprises a light emitting diode chip and a wavelength converting material. The wavelength converting material comprises at least the fluoride phosphor powder disclosed above. The fluoride phosphor powder may be functioned as a red phosphor. In other embodiments, according to demands of a type the light emitting diode chip and a light emitting property of a device, the wavelength converting material may further comprise other kinds of phosphor material, comprising an inorganic phosphor material and/or an organic phosphor material, used together with the red fluoride phosphor powder according to embodiments.

For example, the inorganic phosphor material may comprise an aluminate phosphor powder (such as LuYAG, GaYAG, YAG, etc.), a silicate phosphor powder, a sulfide phosphor powder, a nitride phosphor powder, a fluoride phosphor powder, etc. The organic phosphor material may comprise a single molecule structure, a polymolecule structure, an oligomer, or a polymer. A compound of the organic phosphor material may comprise a group of perylene, a group of benzimidazole, a group of naphthalene, a group of anthracene, a group of phenanthrene, a group of fluorene, a group of 9-fluorenone, a group of carbazole, a group of glutarimide, a group of 1, 3-diphenylbenzene, a group of benzopyrene, a group of pyrene, a group of pyridine, a group of thiophene, a group of 2, 3-dihydro-1H-benzo[de]isoquinoline-1, 3-dione, a group of benzimidazole, or a combination thereof. For example, a yellow phosphor material such as YAG:Ce, and/or an inorganic yellow phosphor powder comprising a component of a oxynitride, a silicate or a nitride, and/or an organic yellow phosphor powder. Optionally, other kinds of red phosphor powders comprising (Sr, Ca)S:Eu, (Ca, Sr)$_2$Si$_5$N$_8$:Eu, CaAlSiN$_3$:Eu, (Sr, Ba)$_3$SiO$_5$:Eu may be used.

The wavelength converting material may be capable of being excited by a first light emitted from the light emitting diode chip to emit a second light having a wavelength different from a wavelength of the first light For example, the light emitting device may be applied in a light emitting diode package structure. In an example for a white light emitting diode package structure, the wavelength-converting material may comprise a green phosphor powder and the red fluoride phosphor powder having the sheet-like crystal according to embodiment, which are excited by a blue light emitting diode; or the wavelength-converting material may comprise the red fluoride phosphor powder having the sheet-like crystal according to embodiment and a yellow phosphor powder, which are excited by the blue light emitting diode; or the wavelength-converting material may comprise the red fluoride phosphor powder having the sheet-like crystal according to embodiment, the green phosphor powder and a blue phosphor powder, which are excited by a UV light emitting diode.

Figure 2:
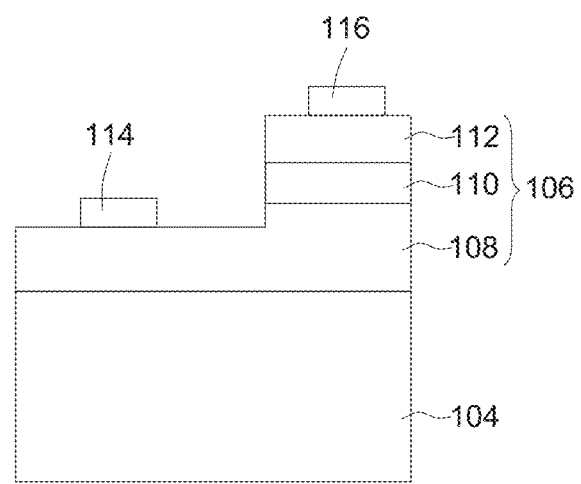
FIG. 2 illustrates a light emitting diode chip according to an embodiment.

FIG. 2 illustrates a light emitting diode chip 102 according to an embodiment. The light emitting diode chip 102 comprises a substrate 104, an epitaxial structure 106, a first electrode 114 and a second electrode 116. The epitaxial structure 106 comprises a first type semiconductor layer 108, an active layer 110 and a second type semiconductor layer 112 stacked from the substrate 104 in order. The first electrode 114 and the second electrode 116 are connected to the first type semiconductor layer 108 and the second type semiconductor layer 112 respectively. The substrate 104 may comprise an insulating material (such as a sapphire material) or a semiconductor material. The first type semiconductor layer 108 and the second type semiconductor layer 112 have opposing conductivity types. For example, the first type semiconductor layer 108 has an N-type semiconductor layer, while the second type semiconductor layer 112 has a P-type semiconductor layer, wherein the first electrode 114 is an N electrode, and the second electrode 116 is a P electrode. For example, the first type semiconductor layer 108 has a P-type semiconductor layer, while the second type semiconductor layer 112 has an N-type semiconductor layer, wherein the first electrode 114 is a P electrode, and the second electrode 116 is an N electrode. The light emitting diode chip 102 may be disposed in a face-up type manner or a flip-chip type manner. In an example relating to the flip-chip type manner, the light emitting diode chip 102 is placed upside down so that the first electrode 114 and the second electrode 116 face a base plate such as a circuit board and are bonded to contact pads through solders.

Figure 3:
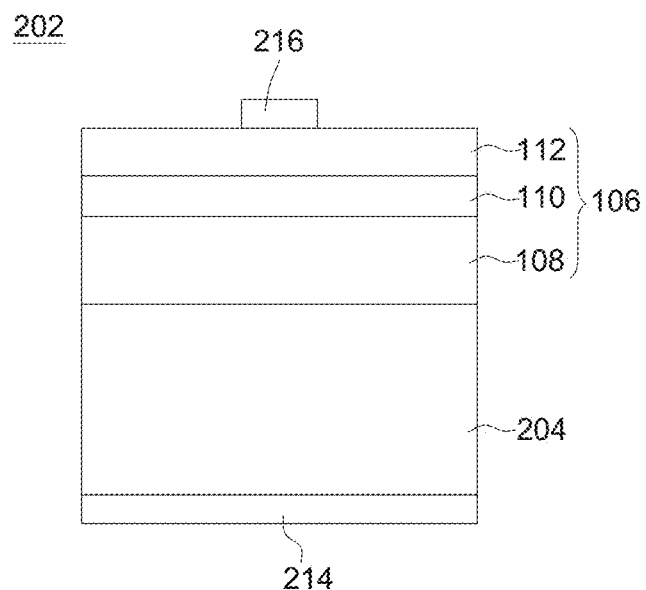
FIG. 3 illustrates a light emitting diode chip according to an embodiment.

FIG. 3 illustrates a light emitting diode chip 202 according to another embodiment. The light emitting diode chip 202 is a vertical light emitting diode chip. The light emitting diode chip 202 comprises a substrate 204 and the epitaxial structure 106. The epitaxial structure 106 comprises the first type semiconductor layer 108, the active layer 110 and the second type semiconductor layer 112 stacked from the substrate 204 in order. A first electrode 214 and a second electrode 216 are connected to the substrate 204 and the second type semiconductor layer 112 respectively. The material of substrate 204 comprises a metal, an alloy, a conductor, a semiconductor, or a combination thereof. The substrate 204 may comprise a semiconductor material having a conductivity type same with a conductivity type of the first type semiconductor layer 108; or a conductive material capable of forming an Ohmi contact to the first type semiconductor layer 108, such as a metal, etc. For example, the first type semiconductor layer 108 has an N-type semiconductor layer, while the second type semiconductor layer 112 has a P-type semiconductor layer, wherein the first electrode 214 is an N electrode, and the second electrode 216 is a P electrode. For example, the first type semiconductor layer 108 has a P-type semiconductor layer, while the second type semiconductor layer 112 has an N-type semiconductor layer, wherein the first electrode 214 is a P electrode, and the second electrode 216 is an N electrode.

In an embodiment, the P-type semiconductor layer may be a P-type GaN material, and the N-type semiconductor layer may be an N-type GaN material. In an embodiment, the P-type semiconductor layer may be a P-type AlGaN material, and the N-type semiconductor layer may be an N-type AlGaN material. The active layer 110 has a multiple quantum well structure.

In an embodiment, the first light emitted from the light emitting diode chip 102, 202 has a wavelength of about 220 nm to 480 nm. In an embodiment, the light emitting diode chip 102, 202 may be the UV light emitting diode chip capable of emitting the first light having a wavelength of about 200 nm to 400 nm. In an embodiment, the light emitting diode chip 102, 202 may be the blue light emitting diode chip capable of emitting the first light having a wavelength of about 430 nm to 480 nm.

In embodiments, the wavelength-converting material of the light emitting device may be contained in a wavelength converting layer. In some embodiments, the wavelength-converting material may be coated on a light emitting side of the light emitting diode chip. Examples of the light emitting devices using the wavelength-converting material are disclosed as below.

Figure 4:
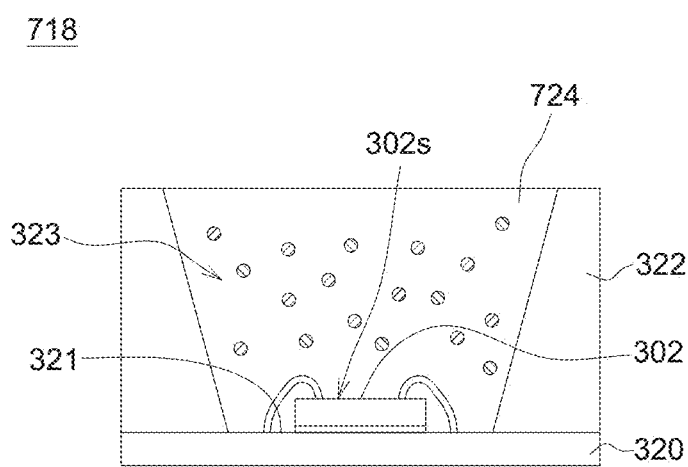
FIG. 4 illustrates a light emitting diode package structure according to an embodiment.

FIG. 4 illustrates a light emitting diode package structure 718 according to an embodiment. The light emitting diode package structure 718 comprises a light emitting diode chip 302, a base 320 and a wavelength converting layer 724. The base 320 has a die bonding region 321 and a wall 322 surrounding the die bonding region 321 and defining a receiving space 323. The light emitting diode chip 302 is disposed in the receiving space 323, and may be attached on the die bonding region 321 of the base 320 through an adhesive, and may be electrically connected to the base 320 by a wire bonding method. The wavelength converting layer 724 fills in the receiving space 323.

The wavelength converting layer 724 may comprise a transparent gel and the wavelength-converting material. The transparent gel may be used as a molding gel, and the wavelength converting material may be doped in the transparent gel. The wavelength converting layer 724 may cover on the light emitting diode chip 302, or may further cover on the base 320. The transparent gel of the wavelength converting layer 724 may comprise a material comprising polymethyl methacrylate (PMMA), polyethylene terephthalate (PET), polystyrene (PS), polypropylene (PP), polyamide (PA), polycarbonate (PC), polyimide (PI), polydimethylsiloxane (PDMS), epoxy, silicone, or a combination thereof, etc.

In other embodiments, the wavelength converting material may be coated on a light emitting surface 302s of the light emitting diode chip 302. Therefore, a luminescent property of the light emitting diode package structure may be controlled by adjusting the molding (transparent) gel comprising the wavelength converting material, and/or the coated layer comprising the wavelength converting material on the surface of the light emitting diode chip 302. The wavelength converting material of the molding gel and/or the coated layer may be varied according to actual demands for a product properly. In an embodiment, the wavelength converting material of at least one of the molding gel and the coated layer comprises the red fluoride phosphor powder $A_2[MF_6]:Mn^{4+}$ with the $Mn^{4+}$ as the activator and having the sheet-like crystal according to embodiments. The concepts may be also applied in other embodiments, and are not repeated hereafter.

Figure 5:
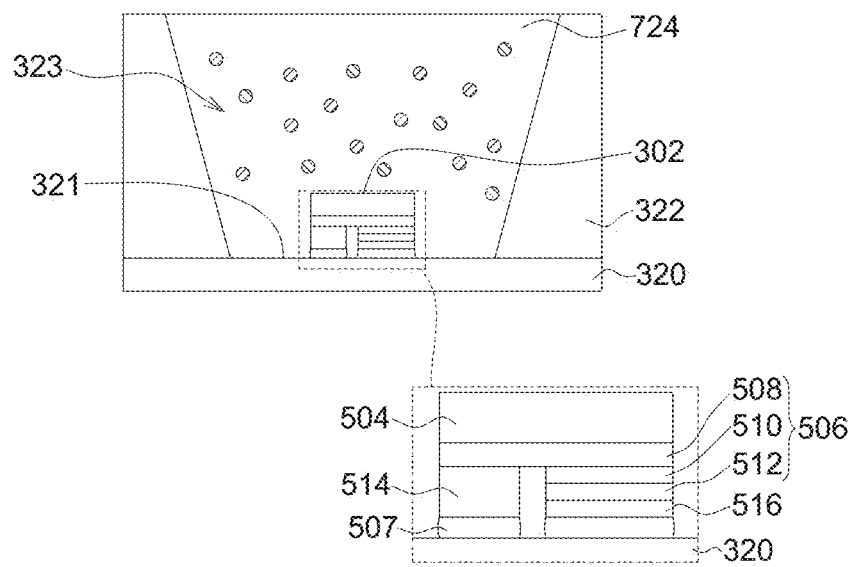
FIG. 5 illustrates a light emitting diode package structure according to an embodiment.

FIG. 5 illustrates a light emitting diode package structure 818 according to an embodiment. The light emitting diode package structure 818 is different from the light emitting diode package structure 718 of FIG. 4 in the light emitting diode chip 302 is disposed on the base 320 with a flip-chip manner.

In this embodiment, for example, the light emitting diode chip 302 may comprise a substrate 504, an epitaxial structure 506, a first electrode 514 and a second electrode 516. The epitaxial structure 506 comprises a first type semiconductor layer 508, an active layer 510 and a second type semiconductor layer 512 stacked from the substrate 504 in order. The first electrode 514 and the second electrode 516 are connected to the first type semiconductor layer 508 and the second type semiconductor layer 512 respectively. The substrate 504 may comprise an insulating material (such as a sapphire material) or a semiconductor material. The first type semiconductor layer 508 and the second type semiconductor layer 512 have opposing conductivity types. For example, the first type semiconductor layer 508 has an N-type semiconductor layer, while the second type semiconductor layer 512 has a P-type semiconductor layer, wherein the first electrode 514 is an N electrode, and the second electrode 516 is a P electrode. For example, the first type semiconductor layer 508 has a P-type semiconductor layer, while the second type semiconductor layer 512 has an N-type semiconductor layer, wherein the first electrode 514 is a P electrode, and the second electrode 516 is an N electrode. The first electrode 514 and the second electrode 516 are electrically connected to the base 320 through a solder 507.

Figure 6:
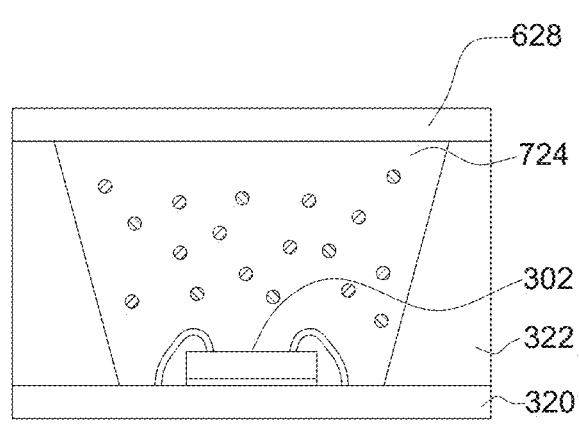
FIG. 6 illustrates a light emitting diode package structure according to an embodiment.

FIG. 6 illustrates a light emitting diode package structure 918 according to an embodiment. Differences between the light emitting diode package structure 918 and the light emitting diode package structure 718 shown in FIG. 4 are disclosed as following. The light emitting diode package structure 918 further comprises the structural element 628 across the wavelength converting layer 724 to be disposed on the wall 322. The structural element 628 may be used for protecting the wavelength-converting material of the wavelength converting layer 724 from a foreign substance that would cause a damage effect, such as moisture, oxygen gas, etc. In embodiments, the structural element 628 may a barrier film and/or a silicon titanium oxide disposed on a surface of the wavelength converting layer 724 to avoid the foreign substance such as moisture, oxygen gas, etc. The silicon titanium oxide may comprise a glass material such as $SiTiO_4$, etc., having a light transmissive characteristic and an antioxidative property, and may be disposed on the surface of the wavelength converting layer 724 by a coating method or a sticking method as a film. The barrier film may comprise an inorganic material, such as a metal/metalloid oxide (such as $SiO_2$, $Al_2O_3$, etc.) or a metal/metalloid nitride (such as $Si_3N_3$, etc.). The barrier film may be a multi-layer barrier film disposed on the surface of the wavelength converting layer 724 by a coating method or a sticking method as a film. The structural element 628 may be applied in other light emitting diode package structures according to embodiments. For example, the structural element 628 may be formed on the wavelength converting layer 724 and the wall 322 of the light emitting diode package structure 818 as shown in FIG. 5.

Figure 7:
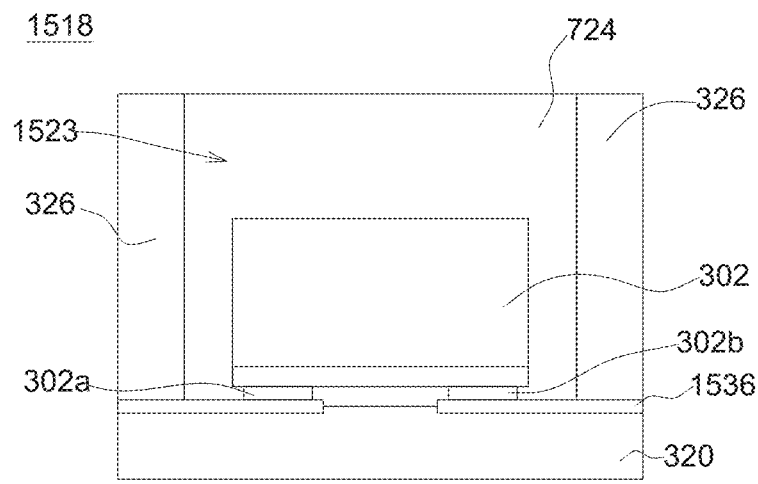
FIG. 7 illustrates a light emitting diode package structure according to an embodiment.

FIG. 7 illustrates a light emitting diode package structure 1518 according to an embodiment. The light emitting diode package structure 1518 comprises the light emitting diode chip 302, the base 320, the wavelength converting layer 724 and a reflective wall 326. The reflective wall 326 is disposed on the base 320 and defines a receiving space 1523. The light emitting diode chip 302 is disposed in the receiving space 1523, and electrically connected to a conductive element 1536 on the base 320 through a first electrode 302a and a second electrode 302b with a flip chip method. The wavelength converting layer 724 is filled in the receiving space 1523, and contact with the light emitting diode chip 302.

The reflective wall 326 may comprise a material having a light-reflective characteristic and a low light leakage, such as a reflective glass, a quartz, a light-reflection attaching sheet, a polymer plastic material or other suitable materials. The polymer plastic material may comprise polymethyl methacrylate (PMMA), polyethylene terephthalate (PET), polystyrene (PS), polypropylene (PP), polyamide (PA), polycarbonate (PC), epoxy, silicone, etc., or a combination thereof. The light reflectivity of the reflective wall 326 may be adjusted by adding an additional filler particle. The filler particle may be a composite material formed by materials having different particle diameters or different materials. For example, the material for the filler particle may comprise $TiO_2$, $SiO_2$, $Al_2O_3$, BN, ZnO, etc. This concept may be applied for other embodiments, and will not be explained again.

Figure 8:
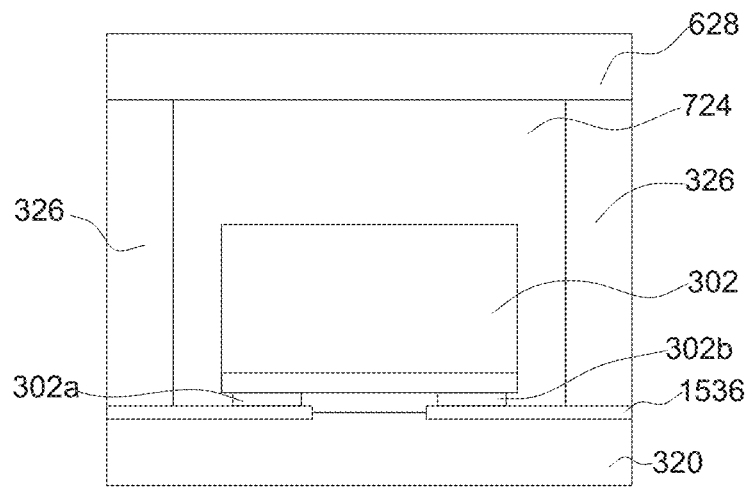
FIG. 8 illustrates a light emitting diode package structure according to an embodiment.

FIG. 8 illustrates a light emitting diode package structure 1618 according to an embodiment. Differences between the light emitting diode package structure 1618 and the light emitting diode package structure 1518 shown in FIG. 7 are disclosed as following. The light emitting diode package structure 1618 further comprises the structural element 628 disposed on the wavelength converting layer 724 and the reflective wall 326, for packaging or protecting the wavelength converting layer 724 from a foreign substance that would cause a damage effect, such as moisture, oxygen gas, etc. In embodiments, the structural element 628 may a barrier film and/or a silicon titanium oxide disposed on the surface of the wavelength converting layer 724 to avoid the foreign substance such as moisture, oxygen gas, etc. The silicon titanium oxide may comprise a glass material such as SiTiO$_4$, etc., having a light transmissive characteristic and an antioxidative property, and may be disposed on the surface of the wavelength converting layer 724 and a surface of the reflective wall 326 by a coating method or a sticking method as a film. The barrier film may comprise an inorganic material, such as a metal/metalloid oxide (such as SiO$_2$, Al$_2$O$_3$, etc.) or a metal/metalloid nitride (such as Si$_3$N$_3$, etc.). The barrier film may be a multi-layer barrier film disposed on the surface of the wavelength converting layer 724 and the surface of the reflective wall 326 by a coating method or a sticking method as a film.

In embodiments, the light emitting diode package structure 718, 818, 918, 1518, or 1618 emits a white light. The light emitting diode chip 302 may be a blue light emitting diode chip. In this case, the wavelength converting layer 724 comprises the red fluoride phosphor powder A$_2$[MF$_6$]:Mn$^{4+}$ with the Mn$^{4+}$ as the activator and having the sheet-like crystal according to embodiments and the yellow phosphor powder. Alternatively, the wavelength converting layer 724 comprises the red fluoride phosphor powder A$_2$[MF$_6$]:Mn$^{4+}$ with the Mn$^{4+}$ as the activator and having the sheet-like crystal according to embodiments and the green phosphor powder. In another embodiment, the light emitting diode chip 302 may be a UV light emitting diode chip. In this case, the wavelength converting layer 724 comprises the red fluoride phosphor powder A$_2$[MF$_6$]:Mn$^{4+}$ with the Mn$^{4+}$ as the activator and having the sheet-like crystal according to embodiments, the green phosphor powder and the blue phosphor powder. The red fluoride phosphor powder A$_2$[MF$_6$]:Mn$^{4+}$ with the Mn$^{4+}$ as the activator and having the sheet-like crystal according to embodiments emits a red light having a peak wavelength in a range of about 600 nm to about 650 nm after being excited by a light having a peak wavelength in a range of about 300 nm to about 470 nm.

Figure 9:
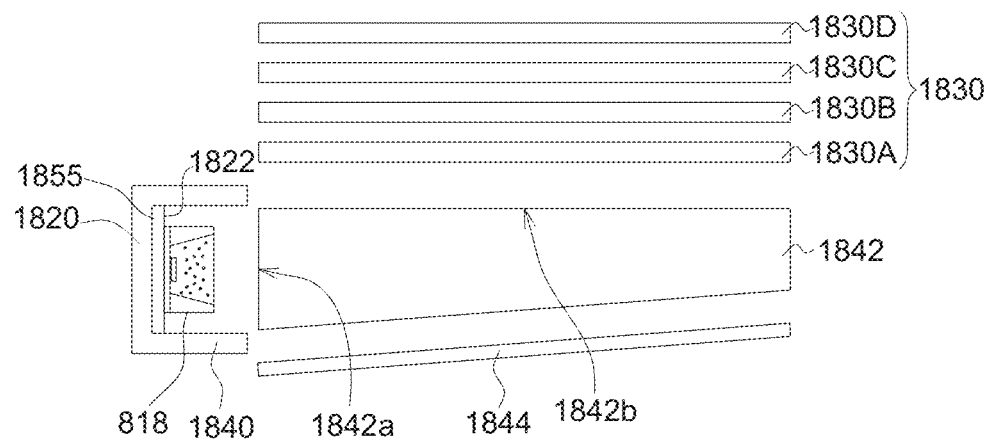
FIG. 9 illustrates a display module according to an embodiment.

FIG. 9 illustrates a side type back light module 1838 according to an embodiment. The side type back light module 1838 comprises a frame 1820, a light source 1822, a light guide plate 1842. The light source 1822 comprises a circuit board 1855 on the frame 1820, and a plurality of the light emitting diode package structures 818 as illustrated with FIG. 5 on the circuit board 1855. The light emitting surface of the light emitting diode package structure 818 faces toward a light incident surface 1842a of the light guide plate 1842. The frame 1820 comprises a reflective sheet 1840. The reflective sheet 1840 can help focusing a light emitted from the light emitting diode package structure 818 toward the light guide plate 1842. The light emitted from a light emitting surface 1842b of the light guide plate 1842 goes upward an optical layer 1830 (or a display panel). For example, the optical layer 1830 may comprise an optical layer 1830A, an optical layer 1830B, an optical layer 1830C, and an optical layer 1830D. For example, the optical layer 1830A and the optical layer 1830D may be diffusion sheets. The optical layer 1830B and the optical layer 1830C may be brightness-enhancement sheets. A reflective sheet 1844 may be disposed under the light guide plate 1842 to direct a light upward to the optical layer 1830A, the optical layer 1830B, the optical layer 1830C, the optical layer 1830D (or a display panel, not shown). In embodiments, the side type back light module is not limited to using the light emitting diode package structure 818 in FIG. 5. The light emitting diode package structure disclosed in other embodiments may be used.

Figure 10:
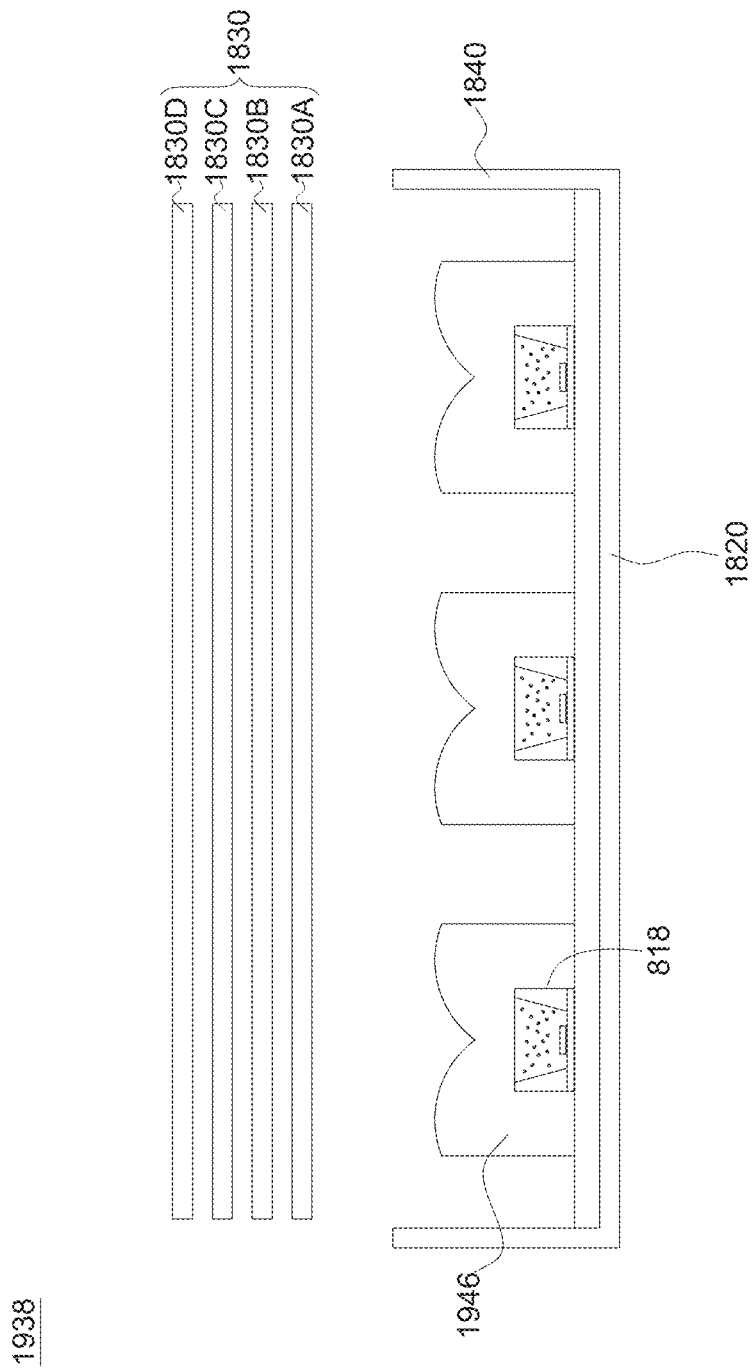
FIG. 10 illustrates a display module according to an embodiment.

FIG. 10 illustrates a direct type back light module 1938 according to an embodiment. The direct type back light module 1938 comprises a secondary optical element 1946 on the light emitting diode package structure 818. The light emitting surface of the light emitting diode package structure 818 faces toward the optical layer 1830. The reflective sheet 1840 can help focusing a light emitted from the light emitting diode package structure 818 toward the optical layer 1830 (or a display panel). In embodiments, the direct type back light module is not limited to using the light emitting diode package structure 818 shown in FIG. 13. The light emitting diode package structure disclosed in other embodiments may be used.

Figure 11:
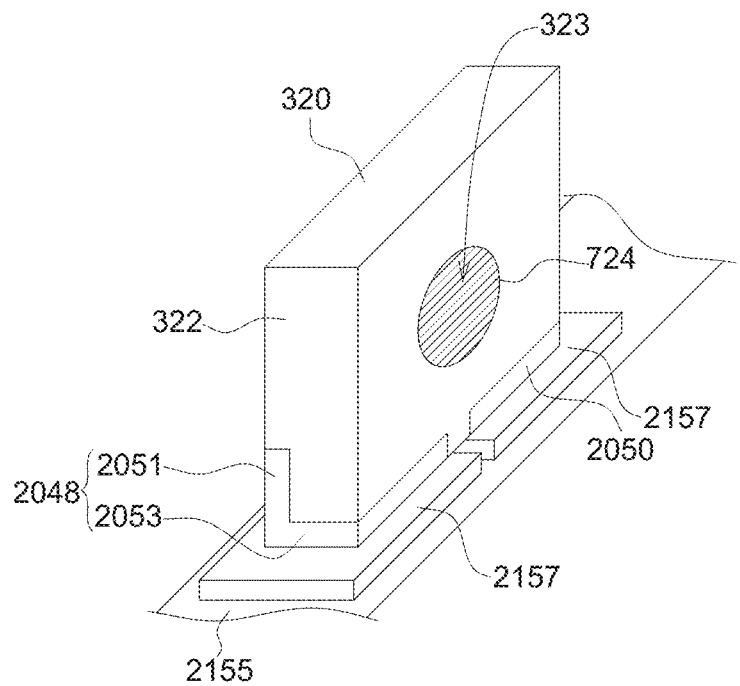
FIG. 11 illustrates a three dimensional view of a light emitting diode package structure according to an embodiment.
Figure 12:
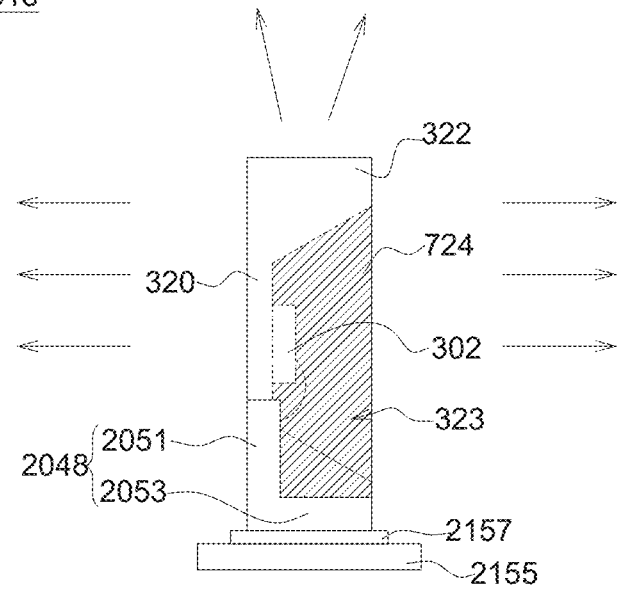
FIG. 12 illustrates a perspective view of a light emitting diode package structure according to an embodiment.

FIG. 11 and FIG. 12 illustrate a three dimensional view and a perspective view of a light emitting diode package structure 2018 according to an embodiment respectively. The light emitting diode package structure 2018 comprises a first electrode 2048 and a second electrode 2050 for electrically connecting to an external component, such as being connected to a connecting pad 2157 of a circuit board 2155. As shown in the figure, the first electrode 2048 and the second electrode 2050 have L shape. A standing portion 2051 of the first electrode 2048 and the second electrode 2050 is on a bottom of the base 320 and exposed by the base 320. A lateral portion 2053 connecting with the standing portion 2051 is embedded in the wall 322 and exposed by the wall 322. A positive electrode and a negative electrode of the light emitting diode chip 302 may be electrically connected to the standing portions 2051 of the first electrode 2048 and the second electrode 2050 through a wire bonding. The wavelength converting layer 724 is filled into the receiving space 323 defined by the base 320 and the wall 322.

Figure 13:
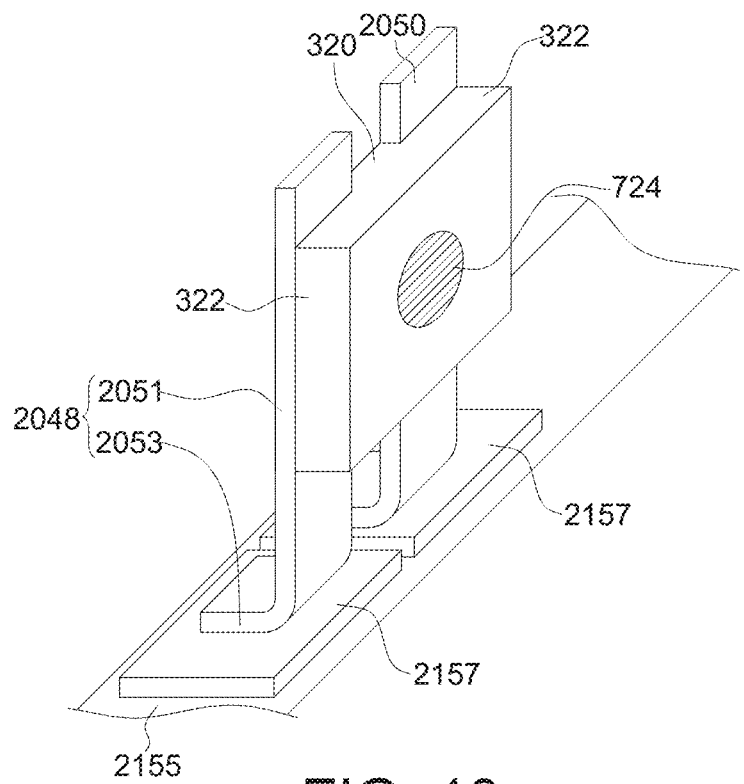
FIG. 13 illustrates a three dimensional view of a light emitting diode package structure according to an embodiment.

FIG. 13 illustrates a three dimensional view of a light emitting diode package structure 2218 according to an embodiment. The light emitting diode package structure 2218 is different from the light emitting diode package structure 2018 shown in FIG. 11, FIG. 12 in that the standing portion 2051 of the first electrode 2048 and the second electrode 2050 having L shape is extended beyond the base 320 and the wall 322. In addition, the lateral portion 2053 connecting with the standing portion 2051 is extended toward a direction back to the wall 322 and electrically connected to the connecting pad 2157 of the circuit board 2155.

In some embodiments, the base 320 and the wall 322 of the light emitting diode package structure 2018 shown in FIG. 11 and FIG. 12, the light emitting diode package structure 2218 of FIG. 13, is formed by the transparent material. Therefore, a light emitted from the light emitting diode chip 302 can goes out the light emitting diode package structure 2018, 2218 though a light emitting surface directly (without being blocked by an opaque material or reflected by a reflective material). For example, the light may be emitted along a direction perpendicular to the base 320 and out from a upper surface and a lower surface of the light emitting diode package structure 2018, 2218 with a wide angle (of larger than 180 degrees for example).

FIG. 14 to FIG. 17 illustrate a manufacturing method for a light emitting device according to an embodiment.

Figure 14:
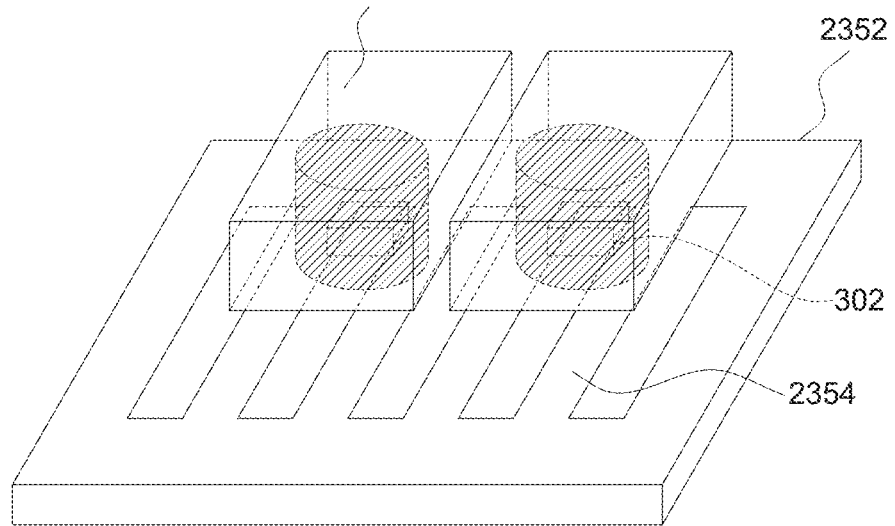
FIG. 14 to FIG. 17 illustrate a manufacturing method for a light emitting device according to an embodiment.
Figure 15:
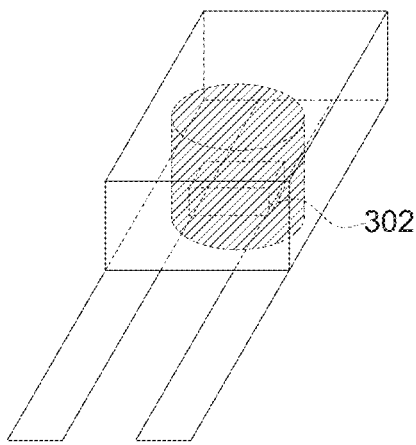

Referring to FIG. 14, a conductive plate 2352 is patterned to form conductive strips 2354 separated from each other. The conductive plate 2352 may be patterned by a method comprising an etching method. Next, a light emitting diode package structure 2318 is disposed on the conductive plate 2352, with a first electrode and a second electrode (not shown) of the light emitting diode package structure 2318 corresponding to the conductive strips 2354 thereby electrically connecting the light emitting diode package structure 2318 to the conductive plate 2352. In an embodiment, the first electrode and the second electrode may be connected to the different conductive strips 2354 spaced apart from each other by a reflow process. Then, the conductive plate 2352 is cut to form a plug-in light emitting unit 2456 as show in FIG. 15. In an embodiment, the cutting step may comprise a punch method.

Figure 16:
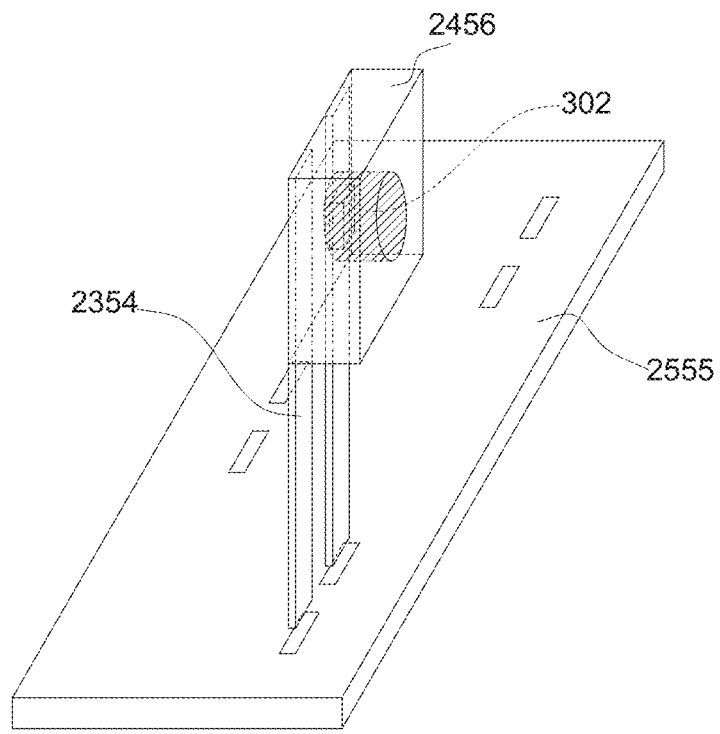

Referring to FIG. 16, then the plug-in light emitting unit 2456 is inserted on the circuit board 2555 to form a light emitting device 2538 having a light bar structure. The plug-in light emitting unit 2456 may be electrically connected to the circuit board 2555 through the conductive strips 2354 used as the first electrode and the second electrode. In an embodiment, the circuit board 2555 comprises a driving circuit for providing an electric power required by the plug-in light emitting unit 2456 to work.

Figure 17:
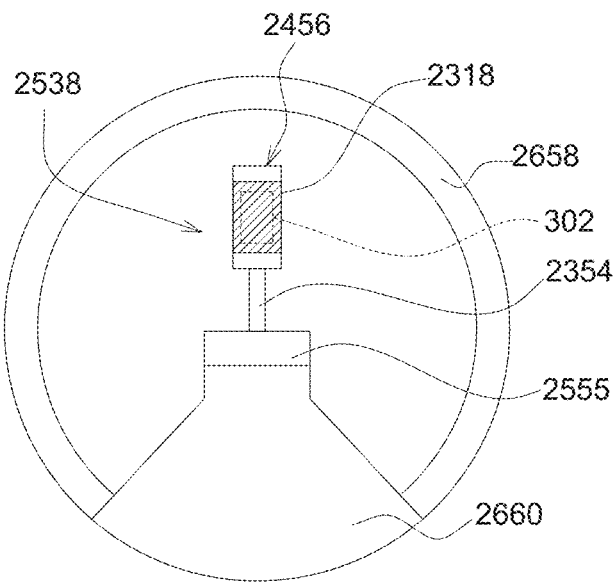

Referring to FIG. 17, the light emitting device 2538 having a light bar structure is disposed on a heat dispersion 2660, and a lamp casing 2658 is disposed to cover the light emitting device 2538, to form a light emitting device 2638 having a tube lamp structure.

In embodiments, for example, the light emitting diode package structure 718, 818, 918, 1518, 1618 as illustrated with FIGS. 4 to 8 may be applied for the light emitting diode package structure 2318. In some embodiments, the light emitting diode package structure 2318 uses the light emitting diode package structure 718, 818, 918 in FIG. 4 to FIG. 6, with the base 320 and the wall 322 formed by the transparent material. Therefore, a light emitted from the light emitting diode chip 302 can goes out the light emitting diode package structure 718, 818, 918 though a light emitting surface directly (without being blocked by an opaque material or reflected by a reflective material). For example, the light may be emitted along a direction perpendicular to the base 320 and out from a upper surface and a lower surface of the light emitting diode package structure 718, 818, 918 with a wide angle (of larger than 180 degrees for example).

In some embodiments, the light emitting diode package structure 2318/plug-in light emitting unit 2456 emits a white light. The light emitting diode chip 302 may be a blue light emitting diode chip. In this case, the wavelength converting layer 724 comprises the red fluoride phosphor powder $A_2[MF_6]:Mn^{4+}$ with the $Mn^{4+}$ as the activator and having the sheet-like crystal according to embodiments and the yellow phosphor powder. Alternatively, the wavelength converting layer 724 comprises the red fluoride phosphor powder $A_2[MF_6]:Mn^{4+}$ with the $Mn^{4+}$ as the activator and having the sheet-like crystal according to embodiments and the green phosphor powder. In another embodiment, the light emitting diode chip 302 may be a UV light emitting diode chip. In this case, the wavelength converting layer 724 comprises the red fluoride phosphor powder $A_2[MF_6]:Mn^{4+}$ with the $Mn^{4+}$ as the activator and having the sheet-like crystal according to embodiments, the green phosphor powder and the blue phosphor powder.

Figure 18:
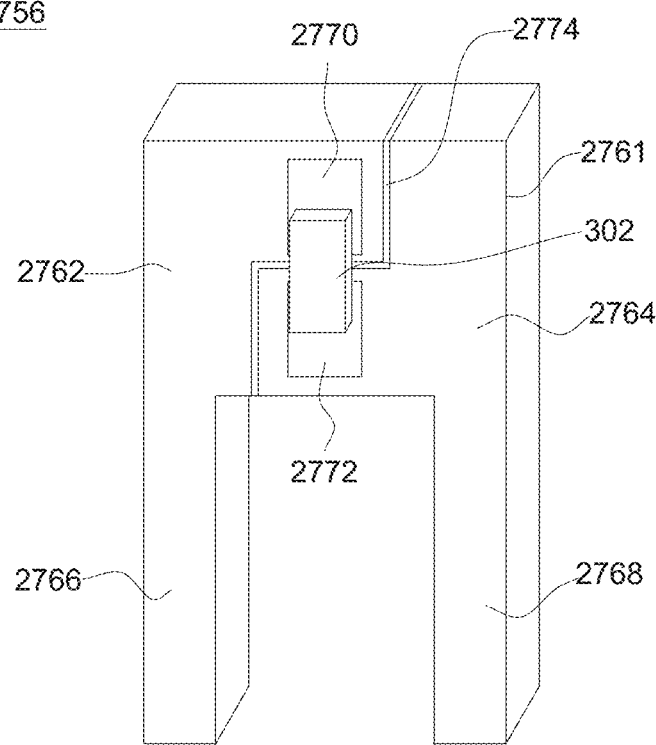
FIG. 18 illustrates a plug-in light emitting unit according to an embodiment.

FIG. 18 illustrates a plug-in light emitting unit 2756 according to an embodiment. The plug-in light emitting unit 2756 comprises the light emitting diode chip 302, a base 2761, a first electrode inserting foot 2766 and a second electrode inserting foot 2768. The base 2761 comprises a first base plate 2762, a second base plate 2764 and an insulating layer 2774. The insulating layer 2774 is disposed between the first base plate 2762 and the second base plate 2764 to electrically insulate the first base plate 2762 from the second base plate 2764. The light emitting diode chip 302 is disposed on a die bonding region contained in the base 2761 used as a die bonding plate. The light emitting diode chip 302 crossing the insulating layer 2774 is disposed on the first base plate 2762 and the second base plate 2764 by a flip chip method. A positive electrode and a negative electrode of the light emitting diode chip 302 is electrically connected to a first contact pad 2770 and a second contact pad 2772 of the first base plate 2762 and the second base plate 2764 so as to electrically connect to the first electrode inserting foot 2766 and the second electrode inserting foot 2768 extended from the first base plate 2762 and the second base plate 2764 respectively. The light emitting diode chip 302 may be electrically connected to the first contact pad 2770 and the second contact pad 2772 through a solder (not shown).

Figure 19:
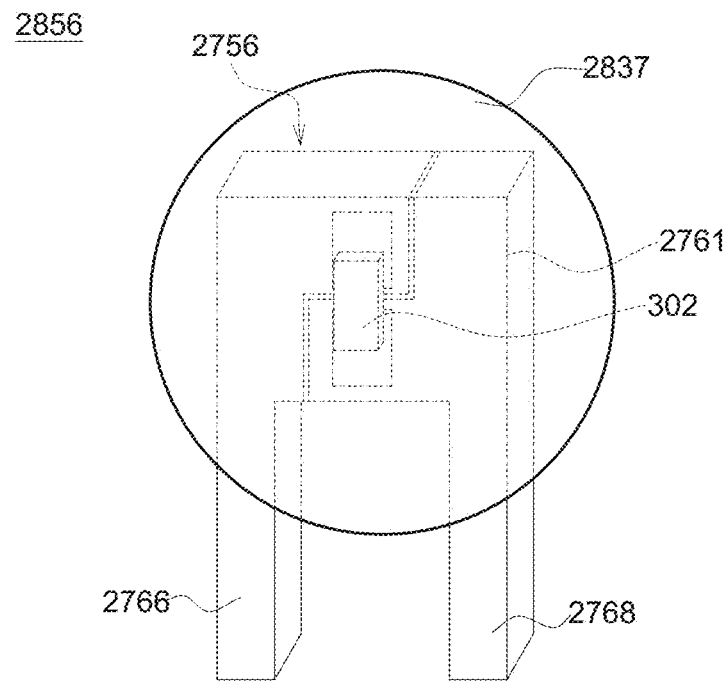
FIG. 19 illustrates a plug-in light emitting unit according to an embodiment.

FIG. 19 illustrates a plug-in light emitting unit 2856 according to another embodiment. The plug-in light emitting unit 2856 comprises a transparent gel 2837 and the plug-in light emitting unit 2756 as illustrated with FIG. 18. The transparent gel 2837 covers the whole of the light emitting diode chip 302 and the base 2761, and covers a portion of the first electrode inserting foot 2766 and the second electrode inserting foot 2768.

Figure 20:
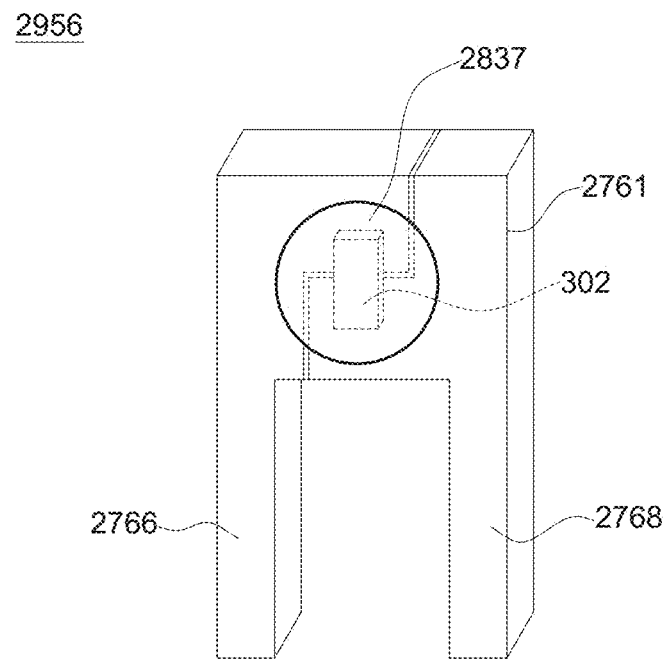
FIG. 20 illustrates a plug-in light emitting unit according to an embodiment.

FIG. 20 illustrates a plug-in light emitting unit 2956 according to another embodiment. The plug-in light emitting unit 2956 is different from the plug-in light emitting unit 2856 shown in FIG. 19 in that the transparent gel 2837 covers the whole of the light emitting diode chip 302, covers a portion of a surface of the base 2761 having the light emitting diode chip 302 thereon, but not covers the first electrode inserting foot 2766 and the second electrode inserting foot 2768.

In embodiments, the plug-in light emitting unit 2856 or 2956 may comprise the wavelength-converting material doped in the transparent gel 2837, or may comprise the wavelength converting layer comprising the wavelength-converting material and disposed on the surface of the light emitting diode chip 302. In embodiments, the transparent gel 2837 may comprise any suitable transparent polymer material, such as, PMMA, PET, PEN, PS, PP, PA, PC, PI, PDMS, epoxy, silicone or other suitable materials, or a combination thereof. The transparent gel 2837 may be doped with other substances to vary an emitting light property according to actual demands. For example, the diffusion particles may be doped into the transparent gel 2837 to change a path of an emitting light. The diffusion particles may comprise $TiO_2$, $SiO_2$, $Al_2O_3$, BN, ZnO, etc., and/or have the same particle diameter or different particle diameters.

Figure 21:
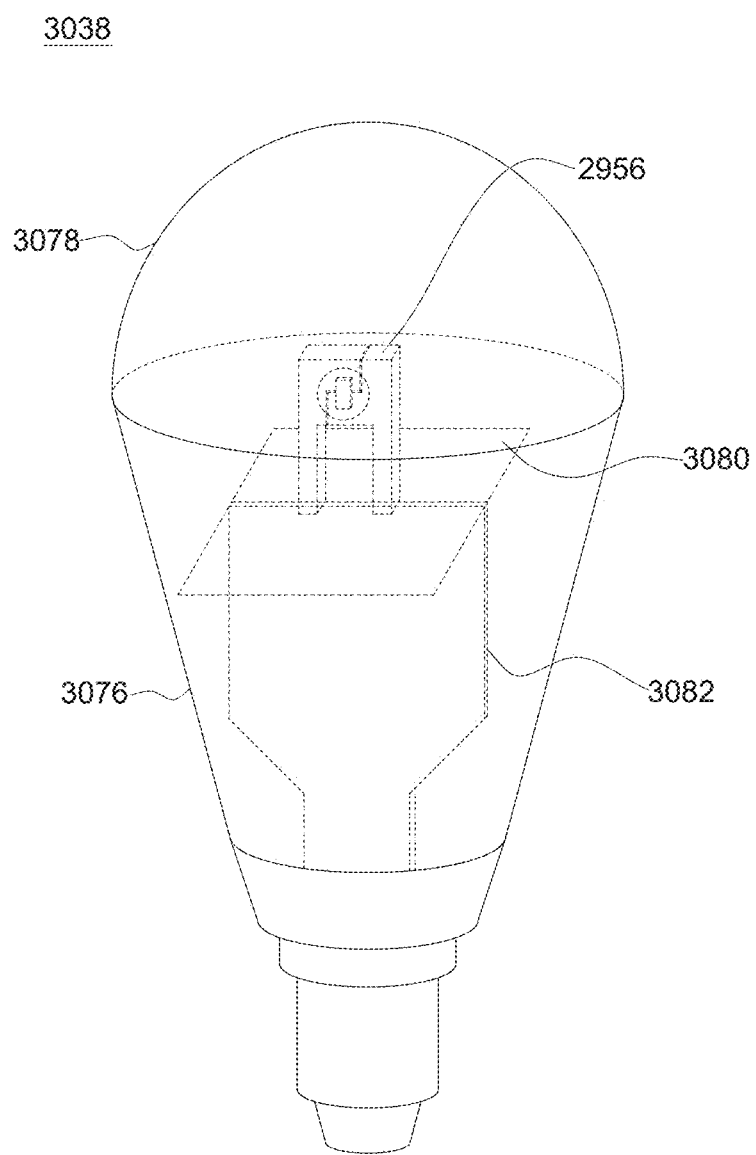
FIG. 21 illustrates a light emitting device according to an embodiment.

FIG. 21 illustrates a light emitting device 3038 according to an embodiment. The light emitting device 3038 having a bulb lamp structure comprises the plug-in light emitting unit 2956 as shown in FIG. 20, a casing body 3076, a transparent lamp cover 3078 and a circuit board 3080. The plug-in light emitting unit 2956 is inserted into the circuit board 3080 and electrically connected to the circuit board 3080 so as to electrically connect to a driving circuit 3082 of the circuit board 3080. The plug-in light emitting unit 2956 is disposed together with the circuit board 3080 in a receiving space defined by the casing body 3076 and the transparent lamp cover 3078 connecting with the casing body 3076.

The transparent gel illustrated in the present disclosure may comprise any suitable transparent polymer material, such as, PMMA, PET, PEN, PS, PP, PA, PC, PI, PDMS, epoxy, silicone or other suitable materials, or a combination thereof.

The transparent gel may be doped with other substances to vary an emitting light property according to actual demands. For example, the diffusion particles may be doped into the transparent gel to change a path of an emitting light.

The diffusion particles may comprise $TiO_2$, $SiO_2$, $Al_2O_3$, BN, ZnO, etc., and/or have the same particle diameter or different particle diameters.

The light emitting device in the present disclosure is not limited to the foregoing embodiments, and may comprise other kinds of the light emitting diode package structures, may be applied for a light emitting module of the display device such as a back light module or a front light module, or a lighting device such as a tube lamp, a bulb lamp, or may have other types of structures.

The light emitting diode package structure of a single unit is not limited to only the light emitting diode chip of a single, and may use the light emitting diode chips of two or more units for emitting lights of the same color/wavelength or different colors/wavelengths.

In embodiments, the light emitting diode package structure 2018 or 2218 and the plug-in light emitting unit 2856 or 2956 emits a white light. The light emitting diode chip 302 may be a blue light emitting diode chip. In this case, the wavelength converting layer 724 comprises the red fluoride phosphor powder $A_2[MF_6]:Mn^{4+}$ with the $Mn^{4+}$ as the activator and having the sheet-like crystal according to embodiments and the yellow phosphor powder. Alternatively, the wavelength converting layer 724 comprises the red fluoride phosphor powder $A_2[MF_6]:Mn^{4+}$ with the $Mn^{4+}$ as the activator and having the sheet-like crystal according to embodiments and the green phosphor powder. In another embodiment, the light emitting diode chip 302 may be a UV light emitting diode chip. In this case, the wavelength converting layer 724 comprises the red fluoride phosphor powder $A_2[MF_6]:Mn^{4+}$ with the $Mn^{4+}$ as the activator and having the sheet-like crystal according to embodiments, the green phosphor powder and the blue phosphor powder. The red fluoride phosphor powder $A_2[MF_6]:Mn^{4+}$ with the $Mn^{4+}$ as the activator and having the sheet-like crystal according to embodiments emits a red light having a peak wavelength in a range of about 600 nm to about 650 nm after being excited by a light having a peak wavelength in a range of about 300 nm to about 470 nm.

The fluoride phosphor powder according to embodiments is not limited to an application of the foregoing light emitting device or device, and may be applied for other products using a phosphor powder. For example, the fluoride phosphor powder according to embodiments may be applied in a wavelength converting element, a photovoltaic conversion device, such as a light emitting diode package, a quantum dot light emitting diode (QLED), a plant illumination device, a solar cell, a bio label, an image sensor, etc.

A number of embodiments are disclosed below to provide detailed descriptions of the disclosure.

《$K_2[TiF_6]:Mn^{4+}$ Phosphor Powder》

The first solution was obtained by mixing and stirring 1.4 g of $KHF_2$, 0.05 g of a solution containing 2-8% of $K_2MnF_6$, and 6-12 ml of HF at the temperature of 0-50° C. for 15 minutes.

The second solution was obtained by mixing and stirring 2.2 ml of 1-propanol and 2 ml of titanium isopropoxide at the room temperature for 15 minutes.

Next, the first solution and the second solution were mixed and stirred at 0° C. for 15 minutes. The mixture was washed with ethanol twice, and then washed with acetone once. Next, the washed mixture was dried with using the oven at 50° C. for 2 hours to obtain a $K_2[TiF_6]:Mn^{4+}$ phosphor powder.

Table 1 lists the results of the obtained $K_2[TiF_6]:Mn^{4+}$ phosphor powder, comprising the crystal flat surface (a), the thickness (d), the a/d value, the internal quantum efficiency (IQE), the absorption (Abs), the external quantum efficiency (EQE), and the corresponding SEM images figures. It can be found from the table 1, the phosphor powders having the sheet-like crystal complying with $2.5<a/d\leq100$ in Embodiments 3 to 6 have a higher external quantum efficiency than the phosphor powders having a bulk shape crystal (a/d=1) and an approximate bulk shape crystal (a/d=2) in Comparative examples 1 and 2.

TABLE 1

Figure 22:
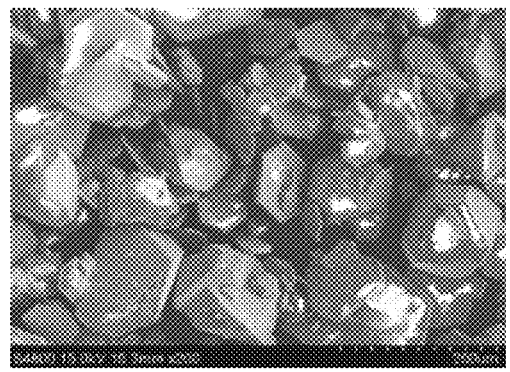
FIG. 22 is a SEM image figure of a phosphor powder having a bulk shape crystal in a comparative example.
Figure 23:
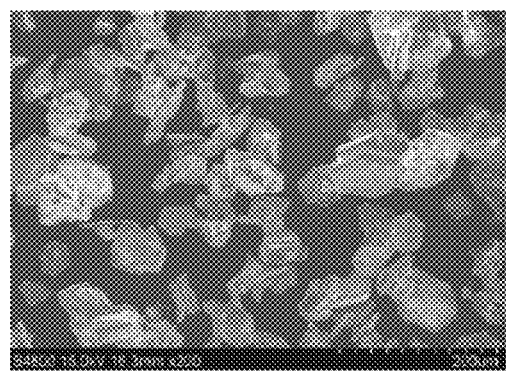
FIG. 23 is a SEM image figure of a phosphor powder having an approximate bulk shape crystal in a comparative example.
Figure 24:
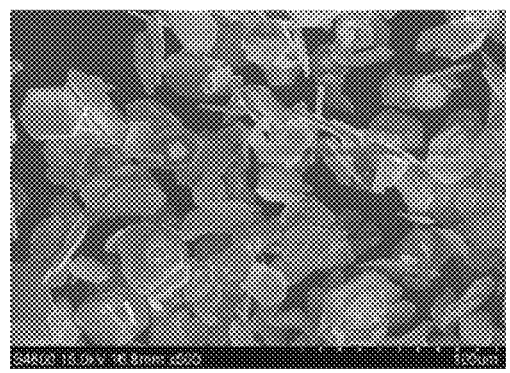
FIG. 24 is a SEM image figure of a phosphor powder having a sheet-like crystal in an embodiment.
Figure 25:
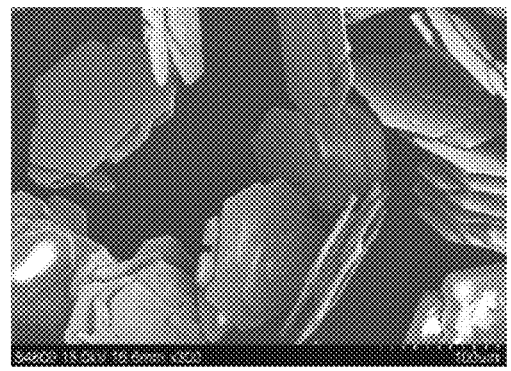
FIG. 25 is a SEM image figure of a phosphor powder having a sheet-like crystal in an embodiment.
Figure 26:
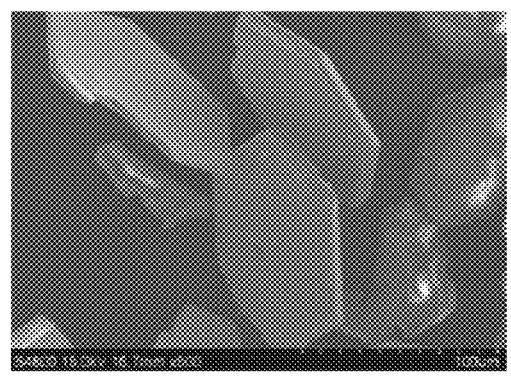
FIG. 26 is a SEM image figure of a phosphor powder having a sheet-like crystal in an embodiment.
Figure 27:
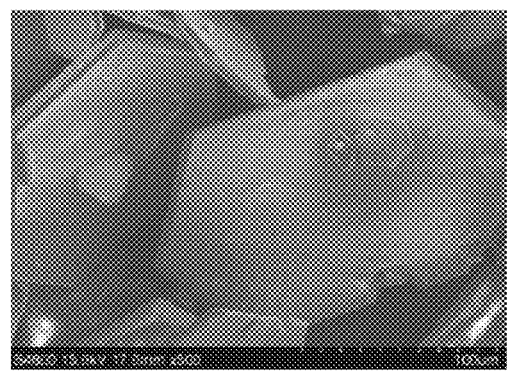
FIG. 27 is a SEM image figure of a phosphor powder having a sheet-like crystal in an embodiment.

| | a [um] | d [um] | a/d | IQE [%] | Abs [%] | EQE [%] | SEM |
|---|---|---|---|---|---|---|---|
| Comparative example 1 | 80 | 80 | 1 | 75.6 | 64.0 | 48.4 | FIG. 22 |
| Comparative example 2 | 60 | 40 | 2 | 68.9 | 74.4 | 51.3 | FIG. 23 |
| Embodiment 3 | 30 | 3 | 10 | 92.2 | 61.7 | 56.8 | FIG. 24 |
| Embodiment 4 | 100 | 3 | 33 | 87.2 | 77.3 | 67.4 | FIG. 25 |
| Embodiment 5 | 100 | 10 | 10 | 90.5 | 78.8 | 71.3 | FIG. 26 |
| Embodiment 6 | 150 | 10 | 15 | 93.2 | 75.6 | 70.4 | FIG. 27 |

According to the foregoing embodiments, the fluoride phosphor powder with the $Mn^{4+}$ as the activator and having the sheet-like crystal has a good luminescent property, and thus can be applied for various devices for improving the luminescent efficiency.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A wavelength converting material, comprising a fluoride phosphor powder with a $Mn^{4+}$ as an activator, wherein the fluoride phosphor powder with the $Mn^{4+}$ as the activator comprises a sheet-like crystal which has a chemical formula of $A_2[MF_6]:Mn^{4+}$, wherein the A is Li, Na, K, Rb, Cs, NH4, or a combination thereof, and the M is Ge, Si, Sn, Ti, Zr, or a combination thereof, the sheet-like crystal has a thickness d, a crystal flat surface of the sheet-like crystal has a maximum length a, wherein the maximum length a is defined as a distance between two end points on an edge of the crystal flat surface and farthest from each other, and $8 \leq a/d \leq 35$.

2. The wavelength converting material according to claim 1, wherein the fluoride phosphor powder with the $Mn^{4+}$ as the activator emits a red light having a peak wavelength in a range of 600 nm-650 nm after being excited by a light having a peak wavelength in a range of 300 nm-470 nm.

3. The wavelength converting material according to claim 1, wherein the fluoride phosphor powder with the $Mn^{4+}$ as the activator has a chemical formula of $K_2[TiF_6]:Mn^{4+}$.

4. The wavelength converting material according to claim 1, wherein the sheet-like crystal comprises two the crystal flat surface substantially parallel to each other, the two crystal flat surfaces have the thickness d therebetween, and one of the two crystal flat surfaces has the maximum length a.

5. The wavelength converting material according to claim 1, wherein the crystal flat surface of the sheet-like crystal is perpendicular to a thickness direction, a=5-200 um.

6. The wavelength converting material according to claim 1, wherein the crystal flat surface is a polygonal crystal flat surface.

7. A light emitting device, comprising:
a light emitting diode chip; and a wavelength converting material being capable of being excited by a first light emitted from the light emitting diode chip to emit a second light having a wavelength different from a wavelength of the first light, wherein the wavelength converting material comprises a fluoride phosphor powder with a $Mn^{4+}$ as an activator, the fluoride phosphor powder with the $Mn^{4+}$ as the activator comprises a sheet-like crystal which has a chemical formula of $A_2[MF_6]:Mn^{4+}$, wherein the A is Li, Na, K, Rb, Cs, NH4, or a combination thereof, and the M is Ge, Si, Sn, Ti, Zr, or a combination thereof, the sheet-like crystal has a thickness d, a crystal flat surface of the sheet-like crystal has a maximum length a, wherein the maximum length a is defined as a distance between two end points on an edge of the crystal flat surface and farthest from each other, and $8 \leq a/d \leq 35$.

* * * * *